United States Patent [19]

Yamada

[11] 3,876,479

[45] Apr. 8, 1975

[54] METHOD FOR PRODUCING A SYNTHETIC RESIN SUBSTRATE

[76] Inventor: Toshio Yamada, 82-1 Takebashichō-2-chome, Nakamura-ku, Nagoya, Japan

[22] Filed: Apr. 20, 1973

[21] Appl. No.: 353,106

[30] Foreign Application Priority Data

Apr. 21, 1972 Japan .............................. 47-39645

[52] U.S. Cl. ..................... 156/3; 156/22; 161/164; 204/33; 204/129.1

[51] Int. Cl. .......................... C23b 3/02; C23f 1/00

[58] Field of Search .................... 204/32, 33, 129.1; 161/164, 170, 183, 185, 231, 257, 263; 156/3, 7, 22, 153, 247, 155

[56] References Cited

UNITED STATES PATENTS

| | | | |
|---|---|---|---|
| 2,663,663 | 12/1953 | Weltman et al. | 156/7 UX |
| 2,930,741 | 3/1960 | Burger et al. | 156/22 UX |
| 2,932,599 | 4/1960 | Dahlgren | 156/3 |
| 3,438,127 | 4/1969 | Lehtonen | 96/36.2 UX |
| 3,574,070 | 4/1971 | Sahely | 156/2 X |
| 3,784,440 | 1/1974 | Grunweld et al. | 156/3 X |

*Primary Examiner*—William A. Powell
*Attorney, Agent, or Firm*—Armstrong, Nikaido & Wegner

[57] ABSTRACT

A synthetic resin substrate having a roughened surface suitable for obtaining a high adhesion with film deposited thereon can be obtained by lamintating an aluminum foil which has been subjected to electrolytic etching and a synthetic resin substrate so that the etched surface of the aluminum foil contacts the resin substrate, combining them under heat and pressure and then removing the aluminum foil by chemical etching.

11 Claims, 1 Drawing Figure

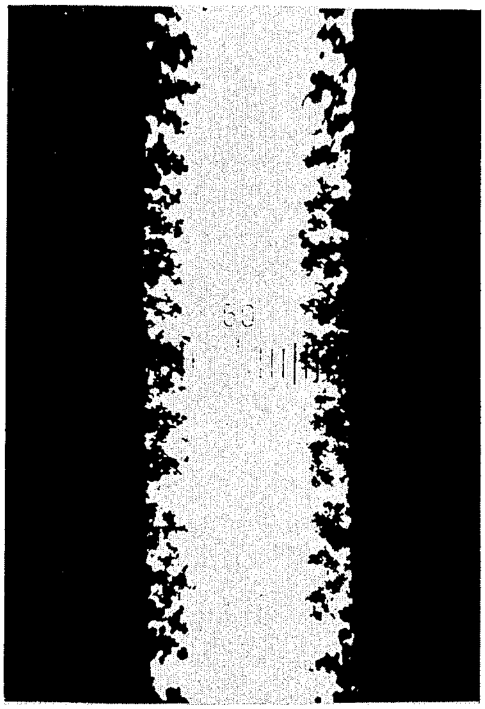

METHOD FOR PRODUCING A SYNTHETIC RESIN SUBSTRATE

This invention relates to a method for producing a synthetic resin substrate having a roughened surface capable of firmly anchoring a metal film formed by electroless plating or films such as ink, paint, etc.

The so-called printed circuits obtained by forming circuits with a conductive metal on an insulating substrate are essential for electronic devices of small size and most of them have been produced by the subtractive method.

Said subtractive method comprises applying a copper foil of 35 – 100$\mu$ in thickness to one side or both sides of a synthetic resin insulating substrate with adhesives, heat, pressure, etc. and removing the copper of unnecessary areas from thus obtained copper laminated plate by etching to obtain final circuit. This method, however, has several defects. One of them is the so-called undercut phenomenon which means the lateral undermining of copper which is to be retained during etching away of unnecessary areas and this phenomenon of undercutting greatly limits the narrowness of the conductor area. Another defect is that according to said method, it is difficult to recover the copper removed by etching and therefore expensive copper is wasted.

Besides said subtractive method, there is a method called the additive method, according to which a conductive metal is plated on only the necessary areas of an insulating substrate to form a circuit. This method includes two cases, namely, a case by which a conductive metal is applied to only the necessary areas only by electroless plating and another case by which firstly a conductive metal is thinly applied to the whole surface, then a conductive metal is applied to only the necessary areas by electrolytic plating and thereafter the thin conductive metal of the other unnecessary areas is removed by etching. This method has substantially no defects as seen in the subtractive method, but the adequate adhesion between the conductive metal of the circuit areas formed by electroless plating and the insulating substrate cannot be obtained and it becomes a conspicuously important problem.

Roughening of the surface of an insulating substrate is one means for solving said problem. Several methods have been proposed for roughening the surface. Examples thereof are as follows: (1) mechanical roughening methods such as sandblasting, liquid honing, ball honing, etc., (2) a method for forming a porous surface by coating thereon a lacquer adhesive in which glass powders, calcium carbonate, aluminum oxide, magnesium oxide, etc. are blended, (3) a method for producing a porous surface by swelling a thermosetting resin such as ABS resin, polypropylene resin, polycarbonate resin, etc. with a solvent and then treating the resin with chromic anhydride or sulfuric acid, (4) a method for producing a porous surface by direct irradiation of an ionization radiation and chemical roughening of a synthetic resin such as polyethylene which is easily decomposed, (5) a method for obtaining a substrate having a roughened surface by pressure laminating an anodic oxidized aluminum foil and a synthetic resin substrate and then removing the aluminum foil by chemical etching. However, all of these methods have defects. That is, according to the method (1), surface area increasing rate is at most 120 – 130 % even if the size of sand is variously changed and adhesiveness is hardly increased. According to the method (2), residue of the filler remains to cause deterioration of the surface state and moreover, increase of adhesiveness cannot be expected. According to the method (3), diethylformamide used as a swelling agent and hexavalent chromium are causes for public pollution and there is a problem in disposal of them. According to the method (4), the substrate is limited to polyethylene and furthermore, various complicated apparatuses are required. According to the method (5) which utilizes assemblage of fine cracks and cells of aluminum oxide film formed by anodic oxidation, the pores are slits in the order of angstrom and surface area increasing rate is also small and in view of the shape of the pores, these pores are not fully transferred to a synthetic resin, especially thermosetting resin substrate. Therefore, sufficiently roughened surface cannot be obtained.

As the result of intensive researches on production of a synthetic resin substrate having a roughened surface suitable for attaining firm adhesion, the inventor has found that the same procedure as of the method (5) is carried out with use of an aluminum foil subjected to electrolytic etching to obtain extremely excellent result.

That is, the method of this invention comprises laminating an aluminum foil subjected to electrolytic etching and a synthetic resin so that the electrolytically etched surface of the aluminum foil contacts the resin, then combining them by application of heat and pressure and thereafter removing said aluminum foil by chemical etching.

This invention will be explained in detail. In the description hereinafter the term "surface area increasing rate" is meant as a magnifying power of a surface area of an electrolytically etched aluminum foil based upon a surface area of an unetched aluminum foil.

The drawing attached hereto is a microphotograph (magnified to 800 times) of cross section of an aluminum foil subjected to electrolytic etching, which is used in this invention.

The aluminum foil used in this invention is one which has been subjected to electrolytic etching. The term "electrolytic etching" herein used means the known method for increasing the surface area of an aluminum foil used for an electrolytic capacitor. That is, it means etching of the aluminum foil by dipping the foil in an electrolytic etching solution and allowing direct current to pass therethrough to effect electrolysis. As the electrolytic etching solution, an aqueous solution containing chloride ion is generally used and specifically 0.5 – 5 % (by weight) aqueous solution of hydrogen chloride or sodium chloride is used. Additives such as acetic acid, sulfuric acid, etc. may be added to the etching solution to improve efficiency of the etching. The conditions for the electrolytic etching are as follows: temperature . . . . 50° – 80°C; current density . . . . 10 – 200 A/dm$^2$; etching time . . . . 30 – 240 seconds. Depth of irregularities on the surface of aluminum foil which are formed by the etching and surface area increasing rate may be widely changed depending on compositions of the etching solution, the electrolytic etching conditions and purity of aluminum. Therefore, said conditions may be optionally determined depending on the desired depth of irregularities and surface area increasing rate. Regarding the electrolytically etched aluminum foil used desirably in this invention, shapes of the irregularities are important and depth of the irregularities is suitably about 1 – 10$\mu$ and the surface area increasing rate is suitably about 10 – 60 times. When shapes of the irregularities are small, the adhesion between the resin substrate and a metal coating formed subsequently by chemical plating and electroplating cannot be improved and when the shapes are too large, uniform circuit conductor cannot be attained at said plating operation.

The electrolytic etching may be directly applied to an aluminum foil and more effectively the foil will be firstly dipped in an aqueous solution of an alkali such as sodium carbonate or caustic soda or an acid such as hydrochloric acid to somewhat roughen the surface and then the surface is subjected to electrolytic etching.

As explained above, electrolytically etched aluminum foil used in this invention is produced by the electrolytic etching method usually employed in production of aluminum electrodes for electrolytic capacitor, and in the untransformed state it has an electrostatic capacity of 60 – 200 $\mu$ F/cm$^2$ when measured with a universal bridge of AC 0.5 V.

The aluminum foil to be etched according to this invention may be any of those which are generally used for electrolytic capacitor and has no limitation in its purity. However, from the economical standpoint such as price of the foil and from the viewpoint of easy removal of the foil combined to a resin substrate by chemical etching, an aluminum foil having an aluminum purity of 99.7 % or less may preferably be used. Therefore, the aluminum foil used in this invention may be of aluminum alloy containing other metals such as iron, copper, silicon and so on.

The thickness of the aluminum foil may be optionally chosen, but too thick foil is meaningless because it is finally removed and a thickness of 10 – 200$\mu$ is suitable.

The synthetic resin substrates to which thus roughened surface of the aluminum foil is to be transferred include those prepared from anyone of thermoplastic and thermosetting resins. Typical thermoplastic resins useful in this invention are ABS resins, polycarbonate resins, polyphenylene oxide resins, polysulfone resins, polyolefin resins such as polypropylene and the like. Typical thermosetting resins useful in this invention are epoxy resins such as the reaction product of bisphenol A and epichlorohydrin, phenolic resins such as the reaction products of phenol, resorcinol or xylenol and formaldehyde, unsaturated polyester resins such as the reaction product of unsaturated dicarboxylic compounds and glycols and the like. The thermosetting resins are used as synthetic resin substrate in the form of the so-called prepregs containing reinforcing element which can be such materials as glass fabric, paper, nonwoven fabric, asbestos, polyester fibers and the like.

The first step of this invention is to combine above mentioned aluminum foil which has been subjected to electrolytic etching with a synthetic resin substrate by a heating press to form a laminated plate. The aluminum foil is put on one side or both sides of the synthetic resin substrate so that the foil with electrolytically etched surface is superposed on the synthetic resin substrate and then the assembly is heated and pressed. The conditions for the above procedure somewhat vary depending upon whether the substrate resin is thermoplastic or thermosetting. In case of thermoplastic resins, temperature is determined depending on the softening point of the resin and is required to be the same as the softening point or slightly higher than the softening point. Pressure is preferably 1 – 50 kg/cm$^2$G. Time is the period from the start until the resin is softened and is preferably about 0.5 – 10 minutes. In case of thermosetting resins, curing of the resin must be completed with heat and pressure. Conditions therefore are suitably as follows: temperature . . . . 100° – 250°C; pressure . . . . 30 – 200 kg/cm$^2$G; and time . . . 60 – 120 minutes. The thermosetting resin in the stage of prepreg is in the partially cured state, but during said heating and pressing, the resin is completely cured in such state that the holes at the surface of the aluminum foil subjected to etching treatment are filled with the resin. Thus a laminated plate is formed. In case of the thermoplastic resin, it is softened and fluidized and again solidified at the stage of reduction of pressure and cooling, but finally the same laminated plate as in the case of the thermosetting resin is obtained. In general, said laminated plate is firstly subjected to mechanical working for producing circuit board such as mechanical cutting, various punching treatments, etc.

Thus obtained mechanically worked laminated plate consisting of an aluminum foil and synthetic resin substrate is subjected to chemical etching which is the second step of this invention to remove the aluminum foil. The chemical etching is carried out by dipping the laminated plate in an aqueous solution of alkali such as caustic soda of about 20 – 30 % or an aqueous solution of acid such as hydrochloric acid and is continued at a temperature of room temperature to 80°C until aluminum is completely removed.

The method of this invention comprises the two steps above mentioned, but may additionally include usual procedures such as washing with water.

The synthetic resin substrate thus obtained has the roughened surface of markedly complicated irregularities. It seems that such result is obtained for the following reasons. That is, when an aluminum foil is subjected to electrolytic etching, innumerable holes of about 1 – 10$\mu$ in depth are formed on the surface and the holes have extremely complicated shapes and the surface area is increased to 20 – 40 times or more on the basis of the surface area of the unetched aluminum foil. The attached drawing is a micro photograph (magnified to 800 times) of cross section of an aluminum foil which was electrolytically etched at a surface area increasing rate of 40 times. In this photograph, the central white part is aluminum foil. It will be recognized from the photograph that the surface is in extremely complicated roughened state. It is clear that the irregularities on the surface of etched alluminum foil are not only complicated, but also suitable for the resin entering thereinto. Therefore, when a synthetic resin is superposed on the surface of this aluminum foil and the assembly is heated and pressed, the resin deeply enters into the holes on the surface of the foil. After the resin is cured at this state, the aluminum foil is removed by chemical etching to obtain a synthetic resin substrate having a surface which has complicated irregularities corresponding to those on the surface of the etched aluminum foil. The shapes of the irregularities on the surface of thus obtained substrate are ideal for obtaining the so-called anchoring effect due to the complexity of the shapes. Therefore, when coatings such as paint, ink, etc. or metal coatings applied by electroless plating are formed on the surface of the substrate, extremely firm adhesion is attained between these coatings and the synthetic resin substrate. Especially when a metal coating is formed by electroless plating, conspicuous effect can be obtained. For example, when a substrate obtained from an aluminum foil (aluminum purity 99.7 %) having a surface area increasing rate of 20 times and an electrostatic capacity of 90 $\mu$ F/cm$^2$ (measured at transformation voltage of 0 V) and an epoxy resin in accordance with this invention was subjected to an electroless copper plating, peeling strength of the copper film was 1.4 – 1.7 kg per width of 1 cm. The same procedure as mentioned above was repeated with use of an aluminum foil having a surface area increasing rate of 40 times and an electrostatic capacity of 130 $\mu$F/cm$^2$ (measured at transformation voltage of 0 V) to obtain a peeling strength of 1.6 – 3.2 kg.

In the description of this invention the peeling strength is measured according to a method provided in JIS C 6481, wherein a copper foil in the test piece of copper clad laminate of 1 cm in width is peeled at an angle of 90° by means of a test machine such as Schopper tensile tester or universal testing machine and measured values are read in Kilogram.

As mentioned before, difficulty in production of a printed circuit by the additive method resides in adhesion between the conductive metal and the substrate. According to this invention, the difficulty is solved and it has become possible to produce circuits having excellent efficiency by the additive method. Thus attained effect is extremely high. That is, the steps required for production of a both sides printed circuit board having throughholes by subtractive method are as follows: formation of copper clad laminated plate-cutting of a large plate-punching with numerical control-deflashing of copper clad-surface treatment in the holes-copper surface treatment-catalyzing-chemical copper plating-primary copper pyrophosphate plating-reverse pattern silk screen plating-secondary copper pyrophosphate plating-gold plating or soldering-removal of ink-etching with ammonium persulfate-surface treatment-outer circumference working, etc. If classified in more detail, these include fifty and several steps.

On the other hand, when similar printed circuit board is produced by the additive method, the steps are formation of surface area increased aluminum foil applied laminate plate—alkali treatment—cutting of large plate—punching with numerical control—catalysing—reverse pattern silk screen printing—chemical copper plating—surface treatment—outer circumference working, etc. and these are at most about 20 steps even if detailedly classified. Thus, there is extreme difference in number of the steps between said two methods. Furthermore, for example, when synthetic resin substrate and copper clad are simultaneously punched, there are various difficulties in cutting conditions and working speed, being different from the case of punching only the synthetic resin substrate. Moreover, when a catalyzer is applied on the copper clad and then copper is chemically applied thereon, peeling of the two layers is apt to occur. Contrary thereto, when a catalyzer is directly applied on a roughened surface of a substrate and then copper is chemically applied thereon, the peeling does not occur.

As explained above, the additive method is much more useful than the subtractive method and by the fact that a substrate having the highly ideal surface state for adhesion can be obtained by this invention, full utilization of advantage of the additive method has become possible.

The method of this invention can also be applied to multi-layer print plate in utterly the same manner as mentioned before. Specifically, a laminated plate to which an electrolytically etched aluminum foil is combined as an outmost surface layer of the multi-layer plate and a thin plate on which wired pattern which is to be an intermediate layer circuit are laminated together with prepregs to obtain a multi-layer plate. Then, circuit is formed through steps of mechanical working and removal of the aluminum foil as in the production of a single-layer plate.

The following examples illustrate this invention and are to be considered not limitive.

EXAMPLE 1

An aluminum foil having an aluminum purity of 99.75 % (impurities: Fe 0.15 %, Cu 0.03 % and Si 0.07 %) was dipped in an electrolytic etching solution comprising a mixture of 1l of water, 80 ml of 35 % hydrochloric acid and 5 cc of concentrated sulfuric acid and electrolytic etching was carried out by passing direct current for 80 seconds at a current density of 15 A/dm$^2$ and at 60°C.

Thus obtained aluminum foil of 100$\mu$ in thickness which had been subjected to electrolytic etching until a surface area increasing rate reached 20 times and a prepreg of 150$\mu$ in thickness obtained by impregnating a glass cloth with an epoxy resin obtained from epichlorohydrin and bisphenol A were laminated so that the treated surface of the aluminum foil contacted the prepreg. Thus obtained laminated plate was placed in multi-stage heat press and was pressed to 30 kg/cm$^2$G at 60°C for 120 minutes to obtain a laminated plate comprising cured glass epoxy resin substrate and an aluminum plate firmly combined to the substrate.

Then, the laminated plate was dipped in a 30 % aqueous solution of sodium hydroxide of 70°C for 10 minutes. As the result, the aluminum foil was completely removed to leave only the substrate.

The surface of thus obtained cured glass epoxy resin which contacted the aluminum foil was a roughened surface having complicated shapes ideal for obtaining anchoring effect.

This substrate was subjected to catalyst treatment and electroless copper plating in accordance with the known methods. Peeling strength of thus formed copper coating (35$\mu$ in thickness) was 1.7 kg per width of 1 cm.

EXAMPLE 2

An aluminum foil of 100$\mu$ in thickness which had been subjected to electrolytic etching until a surface area increasing rate of 20 times was attained in the same manner as in Example 1 and a prepreg of 150$\mu$ in thickness obtained by impregnating a paper with a phenolformaldehyde resin were laminated so that the treated surface of the foil contacted the prepreg. The laminated plate was placed in a multistage heat press and pressed to 150 kg/cm$^2$G at 160°C for 60 minutes to obtain a laminated plate comprising cured resin substrate and aluminum foil firmly combined to the substrate.

Then, this laminated plate was dipped in 30 % hydrochloric acid at 70°C for 10 minutes. As the result, the aluminum foil was completely removed to obtain a substrate having sufficiently roughened surface.

This substrate was subjected to the known electroless copper plating and the peeling strength of thus formed copper plating layer ($35\mu$ in thickness) was 1.8 kg per width of 1 cm.

EXAMPLE 3

An aluminum foil of $50\mu$ in thickness which was subjected to electrolytic etching until a surface area increasing rate of 40 times was attained in the same manner as in Example 1 and a sheet of 1 mm in thickness of polycarbonate resin obtained from bisphenol A and phosgene were laminated so that the treated surface of the aluminum foil contacted the sheet. The laminated plate was pressed in a multistage heat press to 10 kg/cm$^2$G at 160°C and the pressure was reduced with fluidization of the resin and then the laminated plate was cooled to obtain an aluminum foil laminated plate. This laminated plate was then dipped in 30 % aqueous solution of sodium hydroxide at 70°C for 10 minutes. As the result, the aluminum foil was completely removed to obtain a polycarbonate substrate having surface state suitable for attaining firm adhesion.

This substrate was subjected to the known electroless copper plating and peeling strength of thus formed copper plating layer ($35\mu$ in thickness) was 3.2 kg per width of 1 cm.

What is claimed is:

1. In a method for producing a synthetic resin substrate having a roughened surface which comprises laminating an aluminum foil having irregularities on its surface and a synthetic resin substrate so that the aluminum foil having irregularities on its surface is superposed on the synthetic resin substrate; heating and pressing the resultant assembly and thereafter removing the aluminum foil by chemical etching; the improvement wherein an aluminum foil which has been subjected to electrolytic etching is used as said aluminum foil having irregularities on its surface.

2. The method according to claim 1, wherein said electrolytic etching of the aluminum foil is carried out by dippint it in an electrolytic etching solution comprising an aqueous solution containing chloride ion.

3. The method according to claim 2, wherein said electrolytic etching of the aluminum foil is carried out at a temperature of 50° – 80° C, a current density of 10 – 200 A/dm$^2$ and an etching time of 30 – 240 seconds.

4. The method according to claim 1, wherein the depth of the irregularities on the surface of the aluminum foil is about 1 – 10.

5. The method according to claim 1, wherein the surface of the aluminum foil has a surface area increasing rate of 10 – 60 times.

6. The method according to claim 1, wherein the aluminum foil is first dipped in an aqueous solution of an alkali or an acid to roughen the surface and then is subjected to electrolytic etching.

7. The method according to claim 1, wherein the aluminum foil which has been subjected to electrolytic etching has an electrostatic capacity of 60 – 200 $\mu$F/cm$^2$.

8. The method according to claim 1, wherein the aluminum foil has a thickness of 10 – $200\mu$.

9. The method according to claim 1, wherein the synthetic resin is a thermoplastic resin selected from ABS resin, polycarbonate resin, polyphenylene oxide resin, polysulfone resin and polyolefin resin.

10. The method according to claim 1, wherein the synthetic resin is a thermosetting resin selected from epoxy resin, phenolic resin and unsaturated polyester resin.

11. The method according to claim 10, wherein the resin is reinforced with glass cloth, paper, non-woven fabric, asbestos or polyester fibers.

* * * * *